United States Patent
Billings et al.

(10) Patent No.: US 12,280,494 B2
(45) Date of Patent: Apr. 22, 2025

(54) ELECTRICAL TRANSFER ASSEMBLIES FOR ROBOTIC DEVICES

(71) Applicant: Boston Dynamics, Inc., Waltham, MA (US)

(72) Inventors: Devin Billings, Waltham, MA (US); Steven Potter, Waltham, MA (US)

(73) Assignee: Boston Dynamics, Inc., Waltham, MA (US)

( * ) Notice: Subject to any disclaimer, the term of this patent is extended or adjusted under 35 U.S.C. 154(b) by 146 days.

(21) Appl. No.: 18/073,646

(22) Filed: Dec. 2, 2022

(65) Prior Publication Data

US 2024/0181661 A1    Jun. 6, 2024

(51) Int. Cl.
| | |
|---|---|
| *B25J 9/06* | (2006.01) |
| *B25J 17/00* | (2006.01) |
| *B25J 19/00* | (2006.01) |
| *H05K 1/14* | (2006.01) |

(52) U.S. Cl.
CPC ........... *B25J 19/0025* (2013.01); *B25J 17/00* (2013.01); *H05K 1/144* (2013.01)

(58) Field of Classification Search
CPC ........ B25J 19/0025; B25J 17/00; H05K 1/144
See application file for complete search history.

(56) References Cited

U.S. PATENT DOCUMENTS

| 8,673,213 B2 * | 3/2014 | Augstein | G01N 33/4875 422/82.01 |
|---|---|---|---|
| 2004/0000984 A1 * | 1/2004 | Komatsu | H01R 39/24 338/202 |
| 2008/0197710 A1 | 8/2008 | Kreitz et al. | |
| 2019/0000528 A1 | 1/2019 | Yates et al. | |
| 2019/0006806 A1 | 1/2019 | Adams et al. | |
| 2021/0023693 A1 | 1/2021 | Berger et al. | |
| 2022/0302663 A1 * | 9/2022 | Imamura | H01R 39/10 |

FOREIGN PATENT DOCUMENTS

| CN | 202662954 U | | 1/2013 | |
|---|---|---|---|---|
| DE | 102010052645 A1 * | | 5/2012 | ............ H01R 39/10 |
| EP | 1381116 A1 | | 1/2004 | |
| EP | 2458693 A2 | | 5/2012 | |
| EP | 2458693 A3 | | 7/2014 | |

(Continued)

OTHER PUBLICATIONS

Machine translation of DE10201052645 (Year: 2012).*

(Continued)

*Primary Examiner* — Randell J Krug
(74) *Attorney, Agent, or Firm* — PIERCE ATWOOD LLP

(57) ABSTRACT

The invention includes systems and methods for fabrication and use of an assembly for a component of a robot. The assembly includes a first member including a set of electrically conductive annular surfaces, and a second member including a set of electrically conductive components configured to contact the set of electrically conductive annular surfaces. The first member and the second member are included within the component of the robot. Each component in the set of electrically conductive components includes a first convex curvilinear portion configured to contact a corresponding annular surface in the set of electrically conductive annular surfaces.

21 Claims, 8 Drawing Sheets

(56) References Cited

FOREIGN PATENT DOCUMENTS

| | | | |
|---|---|---|---|
| JP | S57138294 U | | 8/1982 |
| JP | 63307679 A | * | 12/1988 |
| JP | S63307679 A | | 12/1988 |
| KR | 102300477 B1 | | 9/2021 |

OTHER PUBLICATIONS

Machine translation of JP S63-307679 (Year: 1988).*

Deringer-Ney, "Electrical Contacts Precious Metal Alloys Slip Rings", https://www.deringerney.com/precious-metal-alloys/slip-rings/, Internet Archive Wayback Machine dated Jun. 11, 2015, 6 pgs, retrieved Feb. 23, 2023.

Deringer-Ney, "Multiple Contact Points", https://www.deringerney.com/assets/1/7/4.1_Multiple_Contact_Points.pdf, Internet Archive Wayback Machine dated Sep. 27, 2021, 5 pgs, retrieved Feb. 23, 2023.

Deringer-Ney, "Paliney H3C-Precious Metal Alloys Custom High Performance Alloys Properties", https://www.deringerney.com/precious-metal-alloys/custom-high-performance-alloys/properties-of-paliney-h3c/, Internet Archive Wayback Machine dated Jun. 11, 2015, 7 pgs, retrieved Feb. 23, 2023.

Deringer-Ney, "Product Sheet Slip Ring Alloys and Components", 1/7, https://www.deringerney.com/assets/1/7/Product-Sheet_Slip-Ring-Alloys-and-Components.pdf, Internet Archive Wayback Machine dated Jun. 22, 2020, 2 pgs, retrieved Feb. 23, 2023.

Deringer-Ney, Strip Wire Rod and Foil Sizes and Tolerances, https://www.deringerney.com/precious-metal-alloys/sizes-and-tolerances/, Internet Archive Wayback Machine dated Jun. 11, 2015, 8 pgs, retrieved Feb. 23, 2023.

Kuebler, "Group Worldwide SR160P Slip Ring Product Details", https://www.kuebler.com/en/products/transmission/slip-rings/product-details/SR160P, Internet Archive Wayback Machine dated Dec. 3, 2020, 2 pgs, retrieved Feb. 23, 2023.

Pitney, "Ney Contact Manual, Electrical Contacts for Low Energy Uses", Electronic Research & Development, the J.M. Ney Company, Bloomfield, CT, USA, 1st Edition, 1973, 181 pgs.

Pitney, "Ney Contact Manual, Section 3.3, Sliding Contact Applications", pp. 131-159, 2022 (8 pages).

Pitney, "Ney Contact Manual, Section 4.1, Multiple Contact Points", pp. 176-183, 2022 (29 pages).

Tauro Technologies, "High Data Rate Rotary Joint Design," Internet Archive Wayback Machine dated Apr. 5, 2021, 5 pgs, retrieved Feb. 23, 2023.

TE Connectivity, "PCB Spring Contacts", 1447360-8, https://www.te.com/usa-en/product-1447360-8.html, Internet Archive Wayback Machine dated Sep. 25, 2019, 5 pgs, retrieved Feb. 23, 2023.

TE Connectivity, ENG DS 6-1773460-8 Spring Fingers, https://www.te.com/commerce/DocumentDelivery/DDEController?Action=srchrtrv&DocNm=6-1773460-8_Spring_Fingers&DocType=DS&DocLang=EN, Internet Archive Wayback Machine dated Sep. 28, 2018, 6 pgs, retrieved Feb. 23, 2023.

TE Connectivity, "PCB Spring Contacts", https://www.te.com/usa-en/products/connectors/pcb-connectors/board-to-board-connectors/spring-finger-contacts.html?tab=pgp-story, Internet Archive Wayback Machine dated Nov. 11, 2022, 11 pgs, retrieved Feb. 23, 2023.

International Search Report and Written Opinion of the International Searching Authority for Application No. PCT/US2023/081102, dated Feb. 29, 2024.

* cited by examiner

ELECTRICAL TRANSFER ASSEMBLIES FOR ROBOTIC DEVICES

TECHNICAL FIELD

This disclosure relates generally to robotics and more specifically to systems, methods and apparatuses, including computer programs, for transferring electrical signals (e.g., power and/or data signals) within robotic devices.

BACKGROUND

A robot is generally defined as a reprogrammable and multifunctional manipulator designed to move material, parts, tools, and/or specialized devices (e.g., via variable programmed motions) for performing tasks. Robots may include manipulators that are physically anchored (e.g., industrial robotic arms), mobile devices that move throughout an environment (e.g., using legs, wheels, or traction-based mechanisms), or some combination of one or more manipulators and one or more mobile devices. Robots are currently used in a variety of industries, including, for example, manufacturing, warehouse logistics, transportation, hazardous environments, exploration, and healthcare.

SUMMARY

Robotic joints typically include a means of transferring electrical signals (e.g., power and/or data signals) across the joints (e.g., to and/or from one or more downstream sensors and/or actuators in one or more distal locations on the robot). Prior systems for allowing electrical signals to cross robotic joints have included custom cable routing designs and/or clock spring devices. However, such solutions can be expensive to engineer and/or can slow the progression of new designs. In addition, such solutions can impose additional suboptimal constraints on the robot, such as limiting the available rotation range of the robotic joints and/or increasing the joints' susceptibility to physical wear-and-tear over time (e.g., because of abrasions to the custom cables and/or strain on the clock spring devices).

The present invention includes systems, methods and apparatuses, including computer programs, for transferring electrical signals (e.g., power and/or data signals) across one or more robotic joints. In one illustrative embodiment, a custom slip ring system is included in an electric actuated rotary joint. The slip ring system includes a first member having a first printed circuit board (PCB) and a second member having a second PCB, the first PCB parallel (or substantially parallel) to the second PCB. The first PCB includes a set of electrically conductive annular surfaces (e.g., concentric rings formed of hard gold). The second PCB includes a set of electrically conductive components (e.g., custom leaf spring contacts including a palladium alloy). In some embodiments, the set of electrically conductive components includes many small contacts that emulate the strands of a stranded wire and are similarly scalable.

Some embodiments described herein can provide advantages over prior setups. One advantage is that by removing a mechanical constraint on rotation of a robotic joint, the robotic joint can rotate continuously (e.g., 360 degrees or more), substantially increasing the available workspace of the attached member (e.g., robotic limb or manipulator). For example, a manipulator arm that is free to rotate continuously can act as a drill or continuous valve turner. As another example, an industrial arm with links that are free to rotate continuously can plan trajectories in an expanded space of possible movement, ultimately creating more efficient trajectories. As a third example, a humanoid robot with a head that can turn in any direction can easily gather sensor data from a wider field of view without having to reorient the humanoid robot. Such examples are non-limiting, and many other examples will be readily apparent to one having ordinary skill in the art.

Other advantages of the invention include increased life span (e.g., exceeding ten million cycles), less labor intensive assembly requirements, lower friction, and higher current carrying capacity for a given actuator assembly size. For example, existing slip ring systems (e.g., for power transmission) often use graphite-based brushes, which tend to wear more quickly, have higher resistance, and shed debris, which can reduce signal quality (e.g., of adjacent signal traces). Some embodiments of the current invention can use a metal-on-metal system for both power and data transmission, adjusting the number of contacts based on the required signal quality and/or current-carrying capacity.

In one aspect, the invention features an assembly. The assembly includes a first member including a set of electrically conductive annular surfaces and a second member including a set of electrically conductive components configured to contact the set of electrically conductive annular surfaces. The first member and the second member are included within a component of a robot. Each component in the set of electrically conductive components includes a first convex curvilinear portion configured to contact a corresponding annular surface in the set of electrically conductive annular surfaces.

In some embodiments, the first member and the second member are included within a joint assembly of the robot. In some embodiments, the first member and the second member are included within an actuator of the robot. In some embodiments, the first member and the second member are included within a wheel drive mechanism of the robot. In some embodiments, the first member is affixed to a body of the robot or a limb of the robot. In some embodiments, the second member is affixed to an end effector of the robot or a limb of the robot. In some embodiments, the first member is continuously rotatable about the second member. In some embodiments, the assembly is configured to transfer electrical current between the first member and the second member. In some embodiments, the assembly is configured to transfer a current of at least 1 amp between the first member and the second member. In some embodiments, each component in the set of electrically conductive components is configured to transfer a current of at least 0.5 amps relative to a corresponding annular surface in the set of electrically conductive annular surfaces. In some embodiments, the first member includes at least five electrically conductive annular surfaces and the second member includes at least five electrically conductive components. In some embodiments, the assembly is configured to transfer one or more data signals between the first member and the second member. In some embodiments, the assembly includes an optical system configured to transfer one or more data signals between the first member and the second member.

In some embodiments, each surface in the set of electrically conductive annular surfaces has a conductivity of at least 10 Megasiemens/meter. In some embodiments, each component in the set of electrically conductive components has a conductivity of at least 1 Megasiemen/meter. In some embodiments, the set of electrically conductive components includes one or more spring contacts. In some embodiments, each component in the set of electrically conductive components includes a laterally offset portion fastened to the second member. In some embodiments, each component in the set of electrically conductive components includes a second convex curvilinear portion configured to recede from the second member. In some embodiments, each component in the set of electrically conductive components includes a second convex curvilinear portion having a substantially semicircular shape. In some embodiments, the first convex curvilinear portion of each component in the set of electrically conductive components has a radius of curvature of between 1 mm and 7 mm at a region of contact with the corresponding annular surface.

In some embodiments, during operation each component in the set of electrically conductive components exerts a force between 0.02-0.40 N on a corresponding annular surface of the first member. In some embodiments, a density of electrically conductive components is at least two electrically conductive components per square centimeter. In some embodiments, a density of electrically conductive components is at least four electrically conductive components per square centimeter. In some embodiments, each electrically conductive component in the set of electrically conductive components is formed from a conductive ribbon or sheet. In some embodiments, each electrically conductive component in the set of electrically conductive components includes a solder tab that has a linear width that is wider than a width of the first convex curvilinear portion. In some embodiments, each solder tab extends laterally beyond a region of each first convex curvilinear portion.

In some embodiments, during assembly, each electrically conductive component in the set of electrically conductive components is configured to remain fixed relative to the second member while experiencing a lateral acceleration of up to 0.5 g. In some embodiments, each electrically conductive component in the set of electrically conductive components includes two conductive contacts separated by a gap. In some embodiments, each electrically conductive component in the set of electrically conductive components includes a contact zone with a distal end curled toward the second member. In some embodiments, each electrically conductive component in the set of electrically conductive components includes a contact zone formed of a bimetallic strip. In some embodiments, each component in the set of electrically conductive components is mounted on a surface of the second member that is parallel to a surface of the first member.

In some embodiments, each component in the set of electrically conductive components exerts a force on a corresponding annular surface of 0.05-0.5N. In some embodiments, a total kinetic frictional force between the first member and the second member varies by no more than 25% when (i) the first member is rotated clockwise with respect to the second member, as compared to when (ii) the first member is rotated counterclockwise with respect to the second member. In some embodiments, each component in the set of electrically conductive components is oriented in a tangential direction to a radius of the second member. In some embodiments, each component in the set of electrically conductive components exerts a contact force in a longitudinal direction of between 5-15 gf over a deformation range of 0.3 mm in the longitudinal direction. In some embodiments, the second member includes a second set of electrically conductive annular surfaces and the first member includes a second set of electrically conductive components configured to contact the second set of electrically conductive annular surfaces. In some embodiments, the assembly further includes a fluorinated lubricant between the first member and the second member. In some embodiments, the annular surfaces are concentric. In some embodiments, the first member comprises a printed circuit board. In some embodiments, the second member comprises a printed circuit board.

In one aspect, the invention features a robot including an assembly in any of the configurations described herein. In some embodiments, the robot is at least one of a humanoid, a biped, a quadruped, a wheeled robot, a tracked robot, or a mobile manipulator robot.

In one aspect, the invention features a robot. The robot includes a robot body, a robot limb coupled to the robot body, an assembly coupled to the robot body and/or the robot limb. The assembly includes a first member including a set of electrically conductive annular surfaces, and a second member including a set of electrically conductive components configured to contact the set of electrically conductive annular surfaces. Each component in the set of electrically conductive components includes a first convex curvilinear portion configured to contact a corresponding annular surface in the set of electrically conductive annular surfaces.

In some embodiments, the first member is coupled to the robot body and the second member is coupled to the robot limb. In some embodiments, the robot limb includes a first component coupled to a second component at a joint, the first member is coupled to the first component, and the second member is coupled to the second component. In some embodiments, the first member is continuously rotatable about the second member.

In one aspect, the invention features a method of use of an assembly. The method comprises providing an assembly in any of the configurations described herein, and providing a preload force between the first member and the second member, the preload force having a magnitude of 0.02-0.40N per electrically conductive component.

In some embodiments, the method further comprises inserting the assembly into at least one of a robotic joint or a robot actuator stack. In some embodiments, the assembly includes a housing fixed to one of the first member or the second member, the housing configured to maintain the preload force. In some embodiments, the assembly further includes a housing configured to protect an interior of the assembly from environmental contamination and/or to retain lubricant applied within the interior of the assembly. In some embodiments, one of the first member or the second member extends radially past the other of the first member or the second member, and an axial interior region of the extending member is configured as a mounting surface for the first member or the second member from which it extends.

In one aspect, the invention features a method of assembly. The method comprises grasping, by a member of a vacuum system, a laterally offset region of an electrically conductive component, adjusting, by the member of the vacuum system, a position and/or a rotation of the electrically conductive component relative to a PCB for a slip ring system, and soldering, at the laterally offset region of the electrically conductive component, the electrically conductive component to the PCB.

In some embodiments, the electrically conductive component comprises a C-shape. In some embodiments, the method further comprises maintaining each electrically conductive component in the set of electrically conductive components fixed relative to the PCB while experiencing a lateral acceleration of up to 0.5 g.

In one aspect, the invention features an actuator assembly. The actuator assembly includes a first member including a set of electrically conductive annular surfaces and a second member including a set of electrically conductive components configured to contact the set of electrically conductive annular surfaces. Each component in the set of electrically conductive components includes a first convex curvilinear portion configured to contact a corresponding annular surface in the set of electrically conductive annular surfaces.

In some embodiments, the first member is affixed to a body of the robot and the second member is affixed to a limb of the robot. In some embodiments, the first member is affixed to a limb of the robot and second member is affixed to an end effector of the robot or another limb of the robot. In some embodiments, the first member is continuously rotatable about the second member. In some embodiments, the actuator assembly is configured to transfer electrical current between the first member and the second member.

In some embodiments, the actuator assembly is configured to transfer a current of at least 1 amp between the first member and the second member. In some embodiments, each component in the set of electrically conductive components is configured to transfer a current of at least 0.5 amps relative to a corresponding annular surface in the set of electrically conductive annular surfaces. In some embodiments, the first member includes at least five electrically conductive annular surfaces and the second member includes at least five electrically conductive components. In some embodiments, the actuator assembly is configured to transfer one or more data signals between the first member and the second member. In some embodiments, the actuator assembly includes an optical system configured to transfer one or more data signals between the first member and the second member. In some embodiments, each surface in the set of electrically conductive annular surfaces has a conductivity of at least 10 Megasiemens/meter. In some embodiments, each component in the set of electrically conductive components has a conductivity of at least 1 Megasiemen/meter.

In some embodiments, the set of electrically conductive components includes one or more spring contacts. In some embodiments, each component in the set of electrically conductive components includes a laterally offset portion fastened to the second member. In some embodiments, each component in the set of electrically conductive components includes a second convex curvilinear portion configured to recede from the second member. In some embodiments, each component in the set of electrically conductive components includes a second convex curvilinear portion having a substantially semicircular shape. In some embodiments, the first convex curvilinear portion of each component in the set of electrically conductive components has a radius of curvature of between 1 mm and 7 mm at a region of contact with the corresponding annular surface.

In some embodiments, during operation each component in the set of electrically conductive components exerts a force between 0.02-0.40 N on a corresponding annular surface of the first member. In some embodiments, a density of electrically conductive components is at least two electrically conductive components per square centimeter. In some embodiments, a density of electrically conductive components is at least four electrically conductive components per square centimeter. In some embodiments, each electrically conductive component in the set of electrically conductive components is formed from a conductive ribbon or sheet. In some embodiments, each electrically conductive component in the set of electrically conductive components includes a solder tab that has a linear width that is wider than a width of the first convex curvilinear portion. In some embodiments, each solder tab extends laterally beyond a region of each first convex curvilinear portion.

In some embodiments, during assembly, each electrically conductive component in the set of electrically conductive components is configured to remain fixed relative to the second member while experiencing a lateral acceleration of up to 0.5 g. In some embodiments, each electrically conductive component in the set of electrically conductive components includes two conductive contacts separated by a gap. In some embodiments, each electrically conductive component in the set of electrically conductive components includes a contact zone with a distal end curled toward the second member. In some embodiments, each electrically conductive component in the set of electrically conductive components includes a contact zone formed of a bimetallic strip. In some embodiments, each component in the set of electrically conductive components is mounted on a surface of the second member that is parallel to a surface of the first member.

In some embodiments, each component in the set of electrically conductive components exerts a force on a corresponding annular surface of 0.05-0.5N. In some embodiments, a total kinetic frictional force between the first member and the second member varies by no more than 25% when (i) the first member is rotated clockwise with respect to the second member, as compared to when (ii) the first member is rotated counterclockwise with respect to the second member. In some embodiments, each component in the set of electrically conductive components is oriented in a tangential direction to a radius of the second member. In some embodiments, each component in the set of electrically conductive components exerts a contact force in a longitudinal direction of between 5-15 gf over a deformation range of 0.3 mm in the longitudinal direction. In some embodiments, the second member includes a second set of electrically conductive annular surfaces and the first member includes a second set of electrically conductive components configured to contact the second set of electrically conductive annular surfaces.

In some embodiments, the actuator assembly further includes a fluorinated lubricant between the first member and the second member. In some embodiments, the annular surfaces are concentric. In some embodiments, the first member comprises a printed circuit board. In some embodiments, the second member comprises a printed circuit board.

BRIEF DESCRIPTION OF DRAWINGS

The advantages of the invention, together with further advantages, may be better understood by referring to the following description taken in conjunction with the accompanying drawings. The drawings are not necessarily to scale, and emphasis is instead generally placed upon illustrating the principles of the invention.

DETAILED DESCRIPTION

Figure 1:
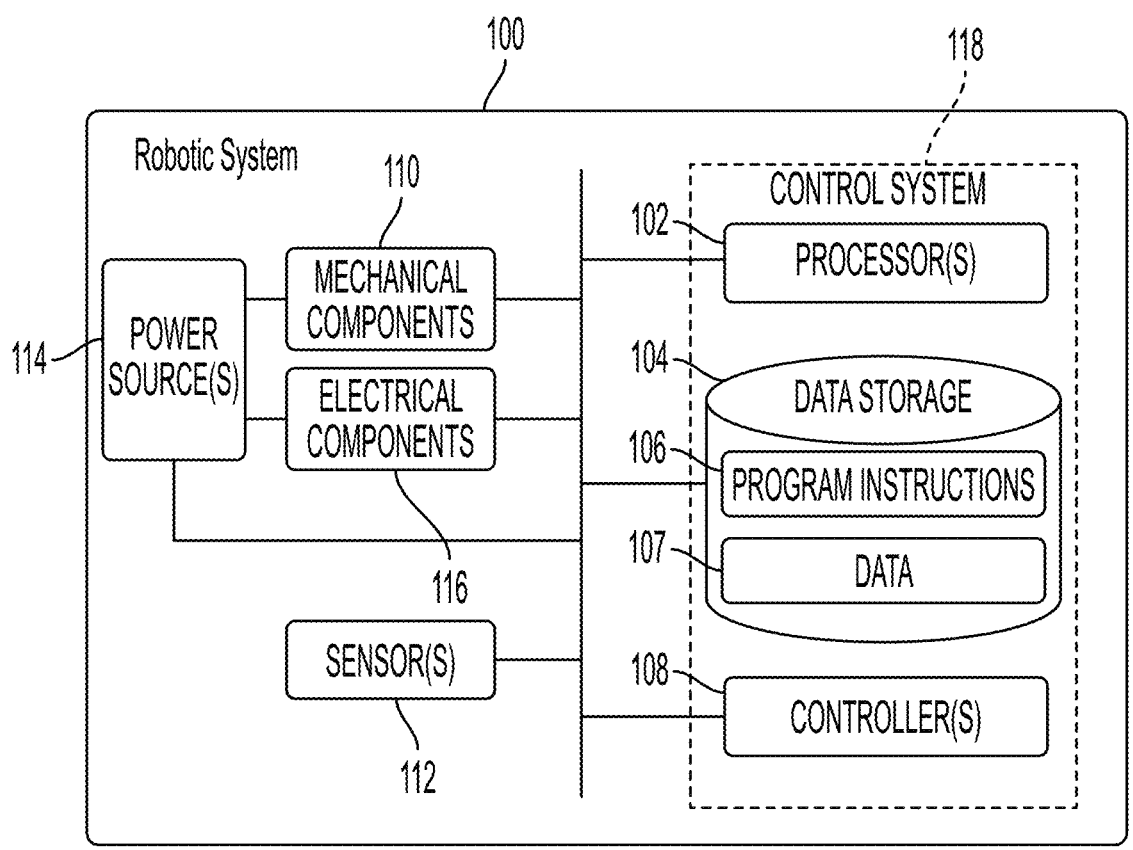
FIG. 1 illustrates an example configuration of a robotic device, according to an illustrative embodiment of the invention.

An example implementation involves a robotic device configured with at least one robotic limb, one or more sensors, and a processing system. The robotic limb may be an articulated robotic appendage including a number of members connected by joints. The robotic limb may also include a number of actuators (e.g., 2-5 actuators) coupled to the members of the limb that facilitate movement of the robotic limb through a range of motion limited by the joints connecting the members. The sensors may be configured to measure properties of the robotic device, such as angles of the joints, pressures within the actuators, joint torques, and/or positions, velocities, and/or accelerations of members of the robotic limb(s) at a given point in time. The sensors may also be configured to measure an orientation (e.g., a body orientation measurement) of the body of the robotic device (which may also be referred to herein as the "base" of the robotic device). Other example properties include the masses of various components of the robotic device, among other properties. The processing system of the robotic device may determine the angles of the joints of the robotic limb, either directly from angle sensor information or indirectly from other sensor information from which the joint angles can be calculated. The processing system may then estimate an orientation of the robotic device based on the sensed orientation of the base of the robotic device and the joint angles.

An orientation may herein refer to an angular position of an object. In some instances, an orientation may refer to an amount of rotation (e.g., in degrees or radians) about three axes. In some cases, an orientation of a robotic device may refer to the orientation of the robotic device with respect to a particular reference frame, such as the ground or a surface on which it stands. An orientation may describe the angular position using Euler angles, Tait-Bryan angles (also known as yaw, pitch, and roll angles), and/or Quaternions. In some instances, such as on a computer-readable medium, the orientation may be represented by an orientation matrix and/or an orientation quaternion, among other representations.

In some scenarios, measurements from sensors on the base of the robotic device may indicate that the robotic device is oriented in such a way and/or has a linear and/or angular velocity that requires control of one or more of the articulated appendages in order to maintain balance of the robotic device. In these scenarios, however, it may be the case that the limbs of the robotic device are oriented and/or moving such that balance control is not required. For example, the body of the robotic device may be tilted to the left, and sensors measuring the body's orientation may thus indicate a need to move limbs to balance the robotic device; however, one or more limbs of the robotic device may be extended to the right, causing the robotic device to be balanced despite the sensors on the base of the robotic device indicating otherwise. The limbs of a robotic device may apply a torque on the body of the robotic device and may also affect the robotic device's center of mass. Thus, orientation and angular velocity measurements of one portion of the robotic device may be an inaccurate representation of the orientation and angular velocity of the combination of the robotic device's body and limbs (which may be referred to herein as the "aggregate" orientation and angular velocity).

In some implementations, the processing system may be configured to estimate the aggregate orientation and/or angular velocity of the entire robotic device based on the sensed orientation of the base of the robotic device and the measured joint angles. The processing system has stored thereon a relationship between the joint angles of the robotic device and the extent to which the joint angles of the robotic device affect the orientation and/or angular velocity of the base of the robotic device. The relationship between the joint angles of the robotic device and the motion of the base of the robotic device may be determined based on the kinematics and mass properties of the limbs of the robotic devices. In other words, the relationship may specify the effects that the joint angles have on the aggregate orientation and/or angular velocity of the robotic device. Additionally, the processing system may be configured to determine components of the orientation and/or angular velocity of the robotic device caused by internal motion and components of the orientation and/or angular velocity of the robotic device caused by external motion. Further, the processing system may differentiate components of the aggregate orientation in order to determine the robotic device's aggregate yaw rate, pitch rate, and roll rate (which may be collectively referred to as the "aggregate angular velocity").

In some implementations, the robotic device may also include a control system that is configured to control the robotic device on the basis of a simplified model of the robotic device. The control system may be configured to receive the estimated aggregate orientation and/or angular velocity of the robotic device, and subsequently control one or more jointed limbs of the robotic device to behave in a certain manner (e.g., maintain the balance of the robotic device). For instance, the control system may determine locations at which to place the robotic device's feet and/or the force to exert by the robotic device's feet on a surface based on the aggregate orientation.

In some implementations, the robotic device may include force sensors that measure or estimate the external forces (e.g., the force applied by a leg of the robotic device against the ground) along with kinematic sensors to measure the orientation of the limbs of the robotic device. The processing system may be configured to determine the robotic device's angular momentum based on information measured by the sensors. The control system may be configured with a feedback-based state observer that receives the measured angular momentum and the aggregate angular velocity, and provides a reduced-noise estimate of the angular momentum of the robotic device. The state observer may also receive measurements and/or estimates of torques or forces acting on the robotic device and use them, among other information, as a basis to determine the reduced-noise estimate of the angular momentum of the robotic device.

The control system may be configured to actuate one or more actuators connected across components of a robotic leg. The actuators may be controlled to raise or lower the robotic leg. In some cases, a robotic leg may include actuators to control the robotic leg's motion in three dimensions. Depending on the particular implementation, the control system may be configured to use the aggregate orientation, along with other sensor measurements, as a basis to control the robot in a certain manner (e.g., stationary balancing, walking, running, galloping, etc.).

In some implementations, multiple relationships between the joint angles and their effect on the orientation and/or angular velocity of the base of the robotic device may be stored on the processing system. The processing system may select a particular relationship with which to determine the aggregate orientation and/or angular velocity based on the joint angles. For example, one relationship may be associated with a particular joint being between 0 and 90 degrees, and another relationship may be associated with the particular joint being between 91 and 180 degrees. The selected relationship may more accurately estimate the aggregate orientation of the robotic device than the other relationships.

In some implementations, the processing system may have stored thereon more than one relationship between the joint angles of the robotic device and the extent to which the joint angles of the robotic device affect the orientation and/or angular velocity of the base of the robotic device. Each relationship may correspond to one or more ranges of joint angle values (e.g., operating ranges). In some implementations, the robotic device may operate in one or more modes. A mode of operation may correspond to one or more of the joint angles being within a corresponding set of operating ranges. In these implementations, each mode of operation may correspond to a certain relationship.

The angular velocity of the robotic device may have multiple components describing the robotic device's orientation (e.g., rotational angles) along multiple planes. From the perspective of the robotic device, a rotational angle of the robotic device turned to the left or the right may be referred to herein as "yaw." A rotational angle of the robotic device upwards or downwards may be referred to herein as "pitch." A rotational angle of the robotic device tilted to the left or the right may be referred to herein as "roll." Additionally, the rate of change of the yaw, pitch, and roll may be referred to herein as the "yaw rate," the "pitch rate," and the "roll rate," respectively.

FIG. 1 illustrates an example configuration of a robotic system that may be used in connection with the implementations described herein. The robotic system 100 may be configured to operate autonomously, semi-autonomously, and/or using directions provided by user(s). The robotic system 100 may be implemented in various forms, such as a biped robot, quadruped robot, or some other arrangement. Furthermore, the robotic system 100 may also be referred to as a robot, robotic device, or mobile robot, among other designations, and could be part of an exoskeleton or human assisting device.

As shown in FIG. 1, the robotic system 100 may include processor(s) 102, data storage 104, and controller(s) 108, which together may be part of a control system 118. The robotic system 100 may also include sensor(s) 112, power source(s) 114, mechanical components 110, and electrical components 116. Nonetheless, the robotic system 100 is shown for illustrative purposes, and may include more or fewer components. The various components of robotic system 100 may be connected in any manner, including wired or wireless connections. Further, in some examples, components of the robotic system 100 may be distributed among multiple physical entities rather than a single physical entity. Other example illustrations of robotic system 100 may exist as well.

Processor(s) 102 may operate as one or more general-purpose hardware processors or special purpose hardware processors (e.g., digital signal processors, application specific integrated circuits, etc.). The processor(s) 102 may be configured to execute computer-readable program instructions 106, and manipulate data 107, both of which are stored in the data storage 104. The processor(s) 102 may also directly or indirectly interact with other components of the robotic system 100, such as sensor(s) 112, power source(s) 114, mechanical components 110, and/or electrical components 116.

The data storage 104 may be one or more types of hardware memory. For example, the data storage 104 may include or take the form of one or more computer-readable storage media that can be read or accessed by processor(s) 102. The one or more computer-readable storage media can include volatile and/or non-volatile storage components, such as optical, magnetic, organic, or another type of memory or storage, which can be integrated in whole or in part with processor(s) 102. In some implementations, the data storage 104 can be a single physical device. In other implementations, the data storage 104 can be implemented using two or more physical devices, which may communicate with one another via wired or wireless communication. As noted previously, the data storage 104 may include the computer-readable program instructions 106 and the data 107. The data 107 may be any type of data, such as configuration data, sensor data, and/or diagnostic data, among other possibilities.

The controller 108 may include one or more electrical circuits, units of digital logic, computer chips, and/or microprocessors that are configured to (perhaps among other tasks), interface between any combination of the mechanical components 110, the sensor(s) 112, the power source(s) 114, the electrical components 116, the control system 118, and/or a user of the robotic system 100. In some implementations, the controller 108 may be a purpose-built embedded device for performing specific operations with one or more subsystems of the robotic system 100.

The control system 118 may monitor and physically change the operating conditions of the robotic system 100. In doing so, the control system 118 may serve as a link between portions of the robotic system 100, such as between mechanical components 110 and/or electrical components 116. In some instances, the control system 118 may serve as an interface between the robotic system 100 and another computing device.

Further, the control system 118 may serve as an interface between the robotic system 100 and a user. The instance, the control system 118 may include various components for communicating with the robotic system 100, including a joystick, buttons, and/or ports, etc. The example interfaces and communications noted above may be implemented via a wired or wireless connection, or both. The control system 118 may perform other operations for the robotic system 100 as well.

During operation, the control system 118 may communicate with other systems of the robotic system 100 via wired or wireless connections, and may further be configured to communicate with one or more users of the robot. As one possible illustration, the control system 118 may receive an input (e.g., from a user or from another robot) indicating an instruction to perform a particular gait in a particular direction, and at a particular speed. A gait is a pattern of movement of the limbs of an animal, robot, or other mechanical structure.

Based on this input, the control system 118 may perform operations to cause the robotic system 100 to move according to the requested gait. As another illustration, a control system may receive an input indicating an instruction to move to a particular geographical location. In response, the control system 118 (perhaps with the assistance of other components or systems) may determine a direction, speed, and/or gait based on the environment through which the robotic system 100 is moving en route to the geographical location.

Operations of the control system 118 may be carried out by the processor(s) 102. Alternatively, these operations may be carried out by the controller 108, or a combination of the processor(s) 102 and the controller 108. In some implementations, the control system 118 may partially or wholly reside on a device other than the robotic system 100, and therefore may at least in part control the robotic system 100 remotely.

Mechanical components 110 represent hardware of the robotic system 100 that may enable the robotic system 100 to perform physical operations. As a few examples, the robotic system 100 may include physical members such as leg(s), arm(s), and/or wheel(s). The physical members or other parts of robotic system 100 may further include actuators arranged to move the physical members in relation to one another. The robotic system 100 may also include one or more structured bodies for housing the control system 118 and/or other components, and may further include other types of mechanical components. The particular mechanical components 110 used in a given robot may vary based on the design of the robot, and may also be based on the operations and/or tasks the robot may be configured to perform.

In some examples, the mechanical components 110 may include one or more removable components. The robotic system 100 may be configured to add and/or remove such removable components, which may involve assistance from a user and/or another robot. For example, the robotic system 100 may be configured with removable arms, hands, feet, and/or legs, so that these appendages can be replaced or changed as needed or desired. In some implementations, the robotic system 100 may include one or more removable and/or replaceable battery units or sensors. Other types of removable components may be included within some implementations.

The robotic system 100 may include sensor(s) 112 arranged to sense aspects of the robotic system 100. The sensor(s) 112 may include one or more force sensors, torque sensors, velocity sensors, acceleration sensors, position sensors, proximity sensors, motion sensors, location sensors, load sensors, temperature sensors, touch sensors, depth sensors, ultrasonic range sensors, infrared sensors, object sensors, and/or cameras, among other possibilities. Within some examples, the robotic system 100 may be configured to receive sensor data from sensors that are physically separated from the robot (e.g., sensors that are positioned on other robots or located within the environment in which the robot is operating).

The sensor(s) 112 may provide sensor data to the processor(s) 102 (perhaps by way of data 107) to allow for interaction of the robotic system 100 with its environment, as well as monitoring of the operation of the robotic system 100. The sensor data may be used in evaluation of various factors for activation, movement, and deactivation of mechanical components 110 and electrical components 116 by control system 118. For example, the sensor(s) 112 may capture data corresponding to the terrain of the environment or location of nearby objects, which may assist with environment recognition and navigation. In an example configuration, sensor(s) 112 may include RADAR (e.g., for long-range object detection, distance determination, and/or speed determination), LIDAR (e.g., for short-range object detection, distance determination, and/or speed determination), SONAR (e.g., for underwater object detection, distance determination, and/or speed determination), VICON® (e.g., for motion capture), one or more cameras (e.g., stereoscopic cameras for 3D vision), a global positioning system (GPS) transceiver, and/or other sensors for capturing information of the environment in which the robotic system 100 is operating. The sensor(s) 112 may monitor the environment in real time, and detect obstacles, elements of the terrain, weather conditions, temperature, and/or other aspects of the environment.

Further, the robotic system 100 may include sensor(s) 112 configured to receive information indicative of the state of the robotic system 100, including sensor(s) 112 that may monitor the state of the various components of the robotic system 100. The sensor(s) 112 may measure activity of systems of the robotic system 100 and receive information based on the operation of the various features of the robotic system 100, such the operation of extendable legs, arms, or other mechanical and/or electrical features of the robotic system 100. The data provided by the sensor(s) 112 may enable the control system 118 to determine errors in operation as well as monitor overall operation of components of the robotic system 100.

As an example, the robotic system 100 may use force sensors to measure load on various components of the robotic system 100. In some implementations, the robotic system 100 may include one or more force sensors on an arm or a leg to measure the load on the actuators that move one or more members of the arm or leg. As another example, the robotic system 100 may use one or more position sensors to sense the position of the actuators of the robotic system. For instance, such position sensors may sense states of extension, retraction, or rotation of the actuators on arms or legs.

As another example, the sensor(s) 112 may include one or more velocity and/or acceleration sensors. For instance, the sensor(s) 112 may include an inertial measurement unit (IMU). The IMU may sense velocity and acceleration in the world frame, with respect to the gravity vector. The velocity and acceleration sensed by the IMU may then be translated to that of the robotic system 100 based on the location of the IMU in the robotic system 100 and the kinematics of the robotic system 100. The robotic system 100 may include other types of sensors not explicated discussed herein. Additionally or alternatively, the robotic system may use particular sensors for purposes not enumerated herein.

The robotic system 100 may also include one or more power source(s) 114 configured to supply power to various components of the robotic system 100. Among other possible power systems, the robotic system 100 may include a hydraulic system, electrical system, batteries, and/or other types of power systems. As an example illustration, the robotic system 100 may include one or more batteries configured to provide charge to components of the robotic system 100. Some of the mechanical components 110 and/or electrical components 116 may each connect to a different power source, may be powered by the same power source, or be powered by multiple power sources. Any type of power source may be used to power the robotic system 100, such as electrical power or a gasoline engine. Additionally or alternatively, the robotic system 100 may include a hydraulic system configured to provide power to the mechanical components 110 using fluid power. The power source(s) 114 may charge using various types of charging, such as wired connections to an outside power source, wireless charging, combustion, or other examples.

The electrical components 116 may include various mechanisms capable of processing, transferring, and/or providing electrical charge or electric signals. Among possible examples, the electrical components 116 may include electrical wires, circuitry, and/or wireless communication transmitters and receivers to enable operations of the robotic system 100. The electrical components 116 may interwork with the mechanical components 110 to enable the robotic system 100 to perform various operations. The electrical components 116 may be configured to provide power from the power source(s) 114 to the various mechanical components 110, for example. Further, the robotic system 100 may include electric motors. Other examples of electrical components 116 may exist as well.

Although not shown in FIG. 1, the robotic system 100 may include a body, which may connect to or house appendages and components of the robotic system. As such, the structure of the body may vary within examples and may further depend on particular operations that a given robot may have been designed to perform. For example, a robot developed to carry heavy loads may have a wide body that enables placement of the load. Similarly, a robot designed to reach high speeds may have a narrow, small body that does not have substantial weight. Further, the body and/or the other components may be developed using various types of materials, such as metals or plastics. Within other examples, a robot may have a body with a different structure or made of various types of materials. The body and/or the other components may include or carry the sensor(s) 112. These sensors may be positioned in various locations on the robotic system 100, such as on the body and/or on one or more of the appendages, among other examples.

On its body, the robotic system 100 may carry a load, such as a type of cargo that is to be transported. The load may also represent external batteries or other types of power sources (e.g., solar panels) that the robotic system 100 may utilize. Carrying the load represents one example use for which the robotic system 100 may be configured, but the robotic system 100 may be configured to perform other operations as well.

As noted above, the robotic system 100 may include various types of legs, arms, wheels, and so on. In general, the robotic system 100 may be configured with zero or more legs. An implementation of the robotic system with zero legs may include wheels, treads, or some other form of locomotion. An implementation of the robotic system with two legs may be referred to as a biped, and an implementation with four legs may be referred as a quadruped. Implementations with six or eight legs are also possible. For purposes of illustration, biped and quadruped implementations of the robotic system 100 are described below.

Figure 2:
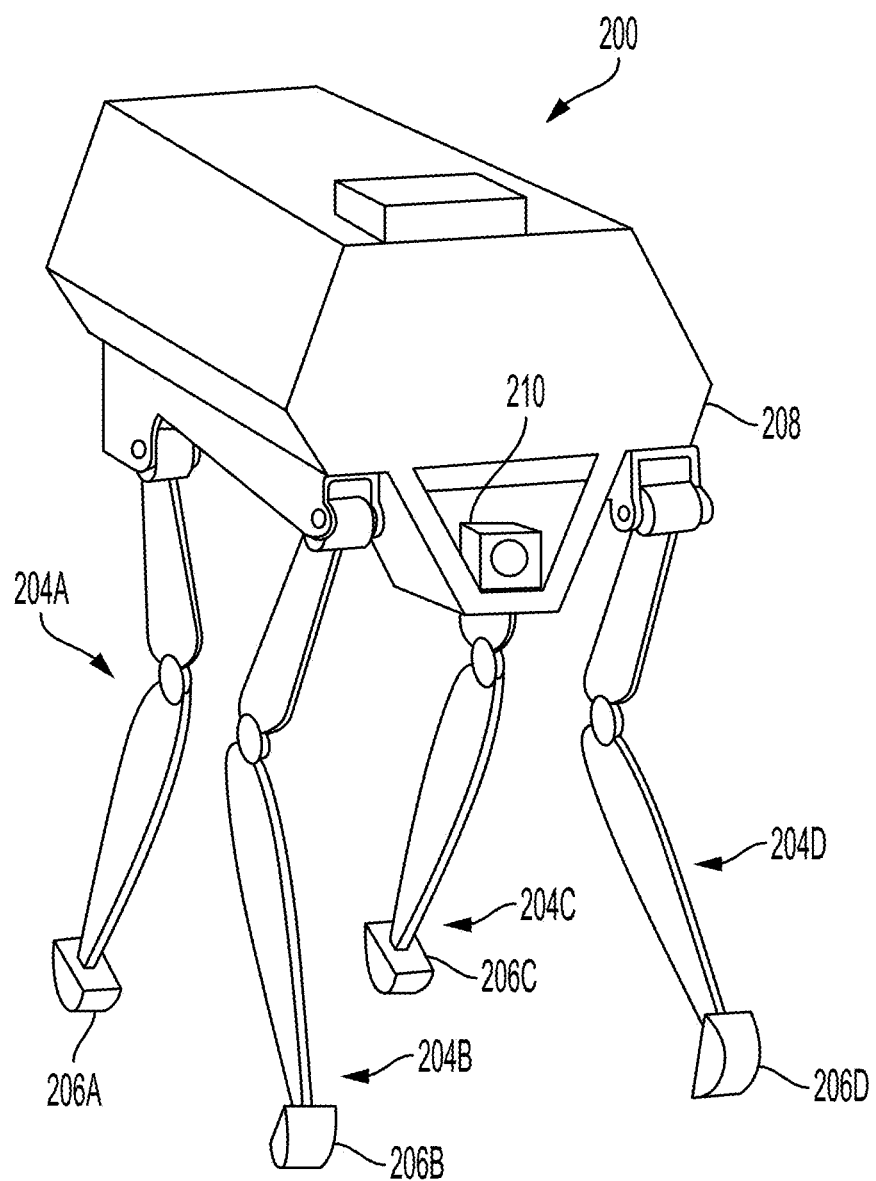
FIG. 2 illustrates an example of a quadruped robot, according to an illustrative embodiment of the invention.

FIG. 2 illustrates a quadruped robot 200, according to an example implementation. Among other possible features, the robot 200 may be configured to perform some of the operations described herein. The robot 200 includes a control system, and legs 204A, 204B, 204C, 204D connected to a body 208. Each leg may include a respective foot 206A, 206B, 206C, 206D that may contact a surface (e.g., a ground surface). Further, the robot 200 is illustrated with sensor(s) 210, and may be capable of carrying a load on the body 208. Within other examples, the robot 200 may include more or fewer components, and thus may include components not shown in FIG. 2.

The robot 200 may be a physical representation of the robotic system 100 shown in FIG. 1, or may be based on other configurations. Thus, the robot 200 may include one or more of mechanical components 110, sensor(s) 112, power source(s) 114, electrical components 116, and/or control system 118, among other possible components or systems. The configuration, position, and/or structure of the legs 204A-204D may vary in example implementations. The legs 204A-204D enable the robot 200 to move relative to its environment, and may be configured to operate in multiple degrees of freedom to enable different techniques of travel. In particular, the legs 204A-204D may enable the robot 200 to travel at various speeds according to the mechanics set forth within different gaits. The robot 200 may use one or more gaits to travel within an environment, which may involve selecting a gait based on speed, terrain, the need to maneuver, and/or energy efficiency. Further, different types of robots may use different gaits due to variations in design. Although some gaits may have specific names (e.g., walk, trot, run, bound, gallop, etc.), the distinctions between gaits may overlap. The gaits may be classified based on footfall patterns—the locations on a surface for the placement the feet 206A-206D. Similarly, gaits may also be classified based on ambulatory mechanics.

The body 208 of the robot 200 connects to the legs 204A-204D and may house various components of the robot 200. For example, the body 208 may include or carry sensor(s) 210. These sensors may be any of the sensors discussed in the context of sensor(s) 112, such as a camera, LIDAR, or an infrared sensor. Further, the locations of sensor(s) 210 are not limited to those illustrated in FIG. 2. Thus, sensor(s) 210 may be positioned in various locations on the robot 200, such as on the body 208 and/or on one or more of the legs 204A-204D, among other examples.

Figure 3:
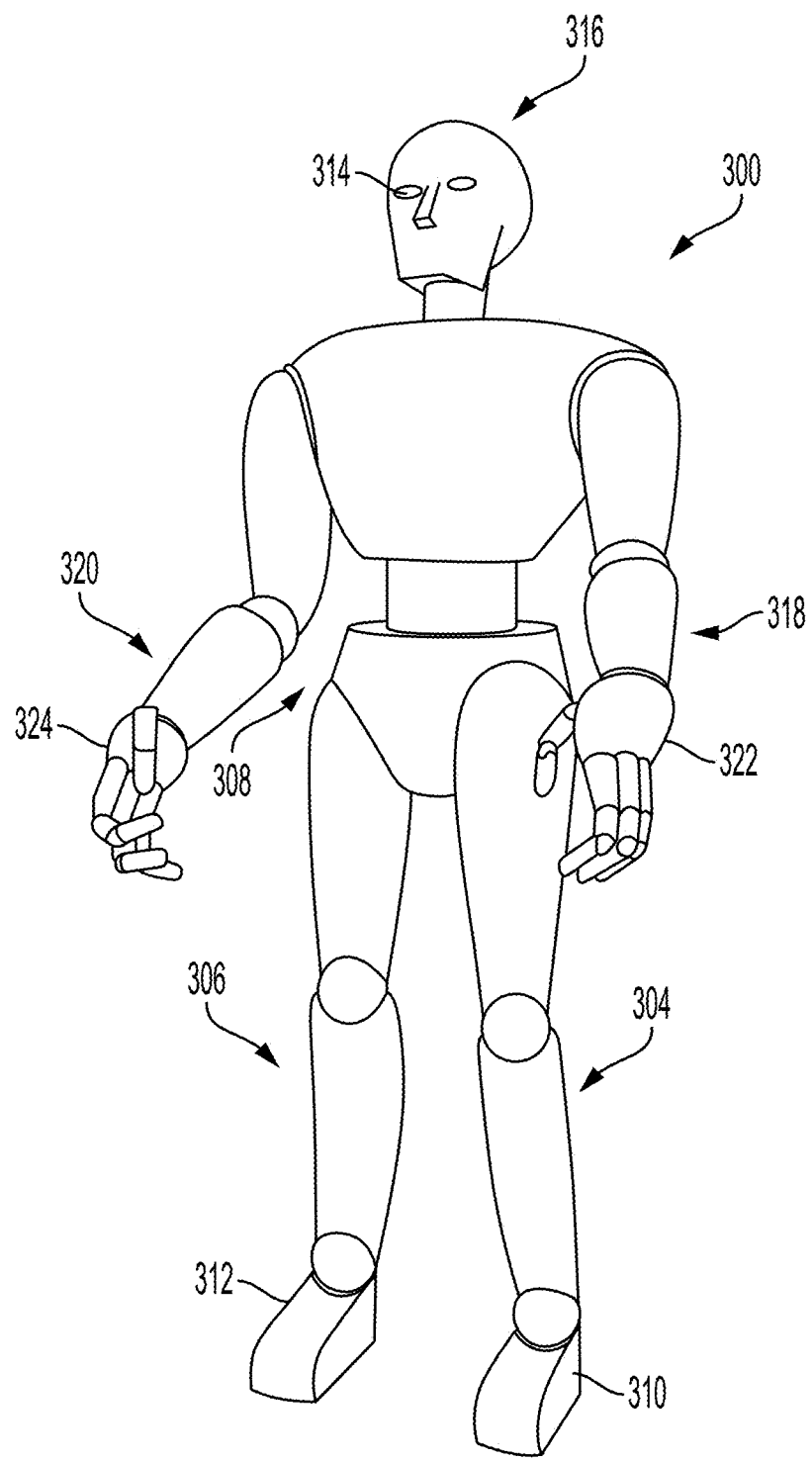
FIG. 3 illustrates an example of a biped robot, according to an illustrative embodiment of the invention.

FIG. 3 illustrates a biped robot 300 according to another example implementation. Similar to robot 200, the robot 300 may correspond to the robotic system 100 shown in FIG. 1, and may be configured to perform some of the implementations described herein. Thus, like the robot 200, the robot 300 may include one or more of mechanical components 110, sensor(s) 112, power source(s) 114, electrical components 116, and/or control system 118. For example, the robot 300 may include legs 304 and 306 connected to a body 308. Each leg may consist of one or more members connected by joints and configured to operate with various degrees of freedom with respect to one another. Each leg may also include a respective foot 310 and 312, which may contact a surface (e.g., the ground surface). Like the robot 200, the legs 304 and 306 may enable the robot 300 to travel at various speeds according to the mechanics set forth within gaits. The robot 300, however, may utilize different gaits from that of the robot 200, due at least in part to the differences between biped and quadruped capabilities.

The robot 300 may also include arms 318 and 320. These arms may facilitate object manipulation, load carrying, and/or balancing for the robot 300. Like legs 304 and 306, each arm may consist of one or more members connected by joints and configured to operate with various degrees of freedom with respect to one another. Each arm may also include a respective hand 322 and 324. The robot 300 may use hands 322 and 324 (or end-effectors) for gripping, turning, pulling, and/or pushing objects. The hands 322 and 324 may include various types of appendages or attachments, such as fingers, grippers, welding tools, cutting tools, and so on. The robot 300 may also include sensor(s) 314, corresponding to sensor(s) 112, and configured to provide sensor data to its control system. In some cases, the locations of these sensors may be chosen in order to suggest an anthropomorphic structure of the robot 300. Thus, as illustrated in FIG. 3, the robot 300 may contain vision sensors (e.g., cameras, infrared sensors, object sensors, range sensors, etc.) within its head 316.

Figure 4A:
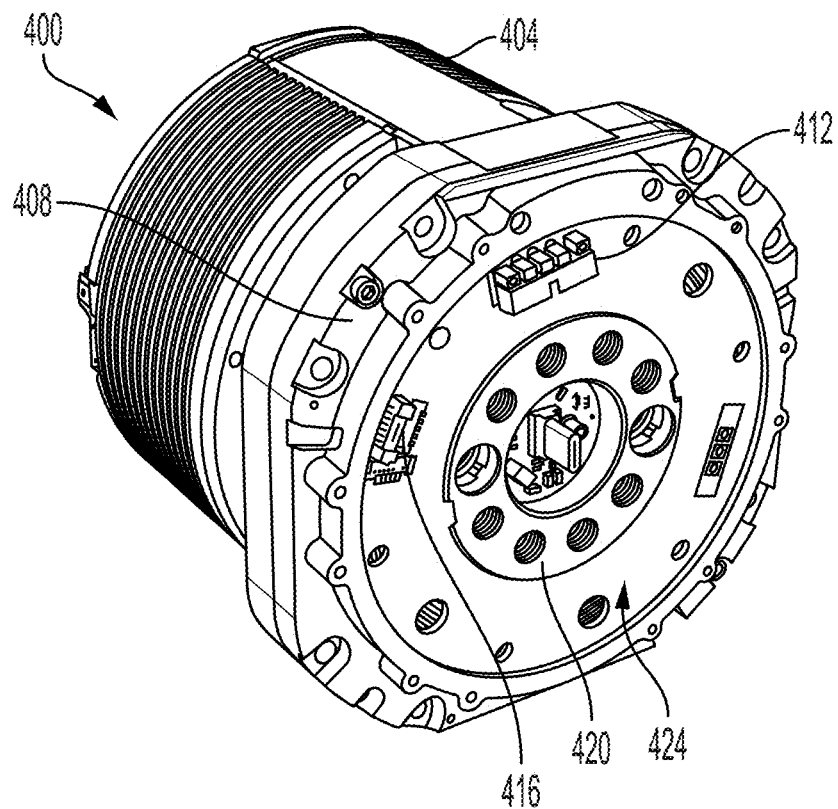
FIG. 4A illustrates an example exterior perspective view a robot actuator that includes a set of members configured to transfer electricity within the actuator, according to an illustrative embodiment of the invention.

FIG. 4A illustrates an example exterior perspective view of a robot actuator 400 that includes a set of members (e.g., two slip rings each having a PCB) configured to transfer electrical signals within the actuator 400, according to an illustrative embodiment of the invention. The set of members can be configured to rotate relative to one another and/or maintain electrical contact during operation to transfer power and/or data signals within the actuator 400. The first member can include a set of electrically conductive annular surfaces. The second member can include a set of electrically conductive components configured to contact the set of electrically conductive annular surfaces. An exterior surface 424 of the second member is visible in FIG. 4A, while the first member is contained in the interior of the actuator 400 and is not visible in FIG. 4A. In some embodiments, each component in the set of electrically conductive components includes a first convex curvilinear portion configured to contact a corresponding annular surface in the set of electrically conductive annular surfaces. Further details of such configurations are shown and described in detail below. The actuator 400 includes a housing 404, a mounting flange 408, a power connecter 412, a signal connector 416, and an output torque interface 420.

Figure 4B:
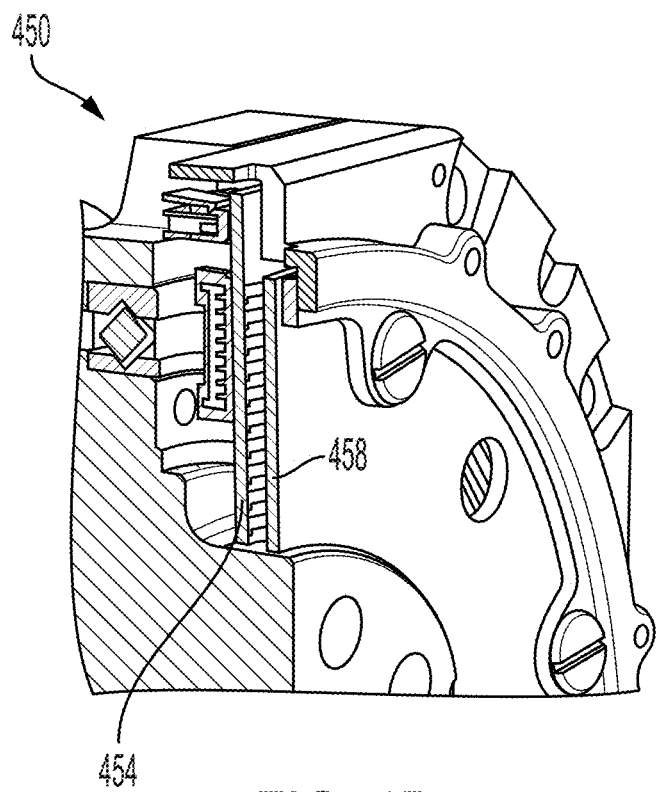
FIG. 4B illustrates an example close-up half-sectional view of a robot actuator that includes a set of members configured to transfer electrical signals within the actuator, according to an illustrative embodiment of the invention.

FIG. 4B illustrates an example close-up half-sectional view of a robot actuator 450 that includes a set of members 454, 458 configured to transfer electrical signals (e.g., power and/or data signals) within the actuator 450, according to an illustrative embodiment of the invention. Here, the first member 454 comprises a first slip ring having a first PCB, and the second member 458 comprises a second slip ring having a second PCB. As shown, the first member 454 is parallel to the second member 458. The first member 454 includes a set of electrically conductive annular surfaces (e.g., concentric rings coated with hard gold), a more detailed example of which is illustrated below in FIG. 7. The second member 458 includes a set of electrically conductive components (e.g., custom leaf spring contacts that provide a life span exceeding ten million cycles), a more detailed example of which is illustrated below in FIG. 7. During operation, electrical current can be transferred between the first member 454 and the second member 458 via the electrically conductive components and the electrically conductive annular surfaces while the first member 454 rotates with respect to the second member 458.

In some embodiments, the set of electrically conductive components includes many small contacts, which may be considered analogous to the strands of a stranded wire (e.g., in terms of unit compartmentalization of charge carriers and/or scalability). In some embodiments, the set of electrically conductive components includes at least five electrically conductive components, although other numbers are also possible (e.g., 6, 8, 12, 16, 24, 48, or another number). In some embodiments, the set of electrically conductive annular surfaces includes at least five electrically conductive annular surfaces, although other numbers are also possible (e.g., 6, 8, 12, 16, 24, 48, or another number). In some embodiments, at least one amp can be transferred between the first member and the second member, although other numbers are possible (e.g., 2, 5, 10, 15, 20, 25, 30, 35, 40, 45, 50, 100A, 200A, 300A, or another number). In some embodiments, each component in the set of electrically conductive components is configured to transfer a current of at least 0.5A relative to a corresponding annular surface in the set of electrically conductive annular surfaces, although other numbers are possible (e.g., 0.1, 0.2, 1, 2, 5, or 10A). In some embodiments, each surface in the set of electrically conductive annular surfaces has a conductivity of at least 10 Megasiemens per meter (MS/m). In some embodiments, some or all of the electrically conductive annular surfaces comprise hard gold. In some embodiments, some or all of the electrically conductive components have a conductivity of at least 1 Megasiemen per meter. In some embodiments, some or all of the electrically conductive components comprise a palladium alloy.

Figure 5:
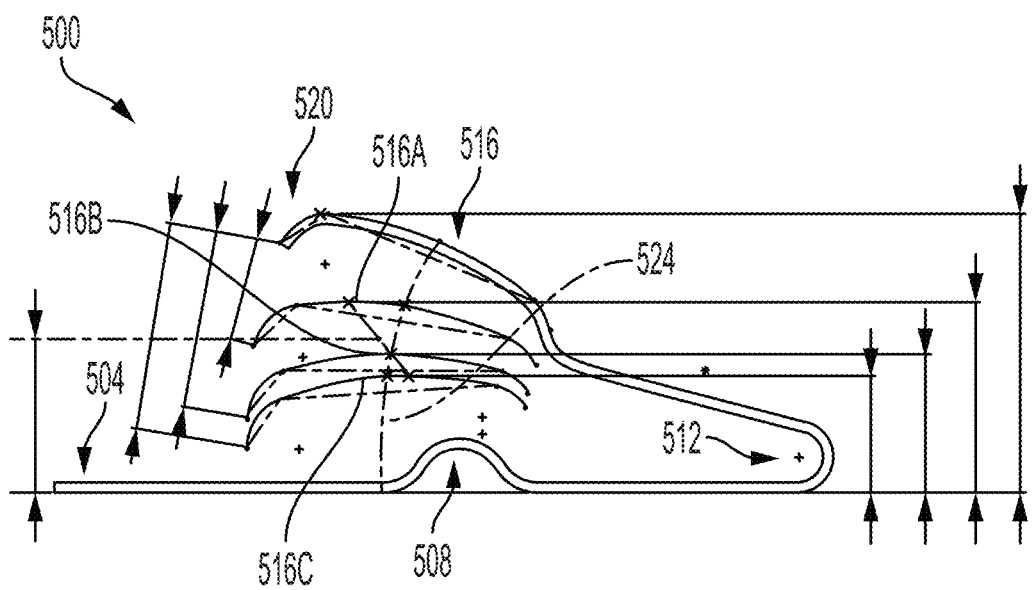
FIG. 5 illustrates an example cross-section of an electrically conductive component, according to an illustrative embodiment of the invention.

FIG. 5 illustrates an example cross-section of an electrically conductive component 500 (e.g., a spring contact for a slip ring system, such as the system shown and described above in FIG. 4), according to an illustrative embodiment of the invention. In some embodiments, the electrically conductive component 500 is a spring contact and/or another form of cantilever beam. In some embodiments, using spring contacts can carry advantages over other types of contacts, e.g., achieving a more consistent force per contact, decreasing stiffness, increasing thermal barrier, and/or improving air conduction across a top of the component.

The electrically conductive component 500 includes a laterally offset portion 504 (e.g., a solder tab), which in FIG. 5 extends further to the left side than the upper portions of the electrically conductive component 500. The laterally offset portion 504 can allow the electrically conductive component 500 to be picked up and placed (e.g., using a vacuum chuck or similar device) during manufacturing and/or assembly. Once placed, the electrically conductive component 500 can be soldered (and/or affixed in a stable enough manner not to move during a solder reflow operation). Such a feature can provide an improvement over existing slip ring systems, which are not compatible with high-rate pick and place PCB fabrication equipment. Instead, leaf-spring contacts are typically hand-loaded into a jig and/or hand-soldered into holes in a PCB—a process that can be less efficient and/or cost-effective.

The electrically conductive component 500 also includes a region 508, which bulges locally upward (e.g., in a substantially semicircular fashion as shown in cross-section, or a cylindrical or spherical fashion in three dimensions) from the rest of the flat surface that is otherwise configured to lay flat against the PCB. The region 508 can prevent solder from wicking along the bottom of the electrically conductive component 500. The electrically conductive component 500 also includes a region 512 (e.g., a convex curvilinear portion) in which the electrically conductive component 500 bends around such that that the remainder of the electrically conductive component 500 extends with directional components in the upward and/or the antiparallel direction to the bottom of the electrically conductive component 500 (e.g., including the region 504). The electrically conductive component 500 also includes a convex curvilinear portion 516. The convex curvilinear portion 516 can be configured to contact a corresponding annular surface of the opposing member (e.g., the one shown below in FIG. 7.). In some embodiments, the convex curvilinear portion 516 can help maintain a substantially constant contact force (e.g., within a 25% variation) regardless of direction of rotation (e.g., clockwise, which may correspond to a "knifing" contact) or the opposite direction (e.g., counter-clockwise, which may correspond to a "dragging" contact). The electrically conductive component 500 also includes a distal end 520. The distal end 520 can be curled downward (e.g., toward the member including the set of electrically conductive components, when assembled as described in FIGS. 4A-4B). In some embodiments, such a feature can help avoid gouging of the corresponding electrically conductive annular surfaces that the set of electrically conductive components contacts (e.g., during assembly).

FIG. 5 shows the convex curvilinear portion 516 with no compressive forces applied as well as further renditions 516A-C of the convex curvilinear portion 516 with various compressive forces applied from the top (e.g., as would be applied when assembled with a corresponding member having a PCB with electrically conductive annular surfaces configured to contact the electrically conductive components). Rendition 516A shows the convex curvilinear portion 516 compressed by a first force, which can result in a first displacement along curvilinear axis 524. Rendition 516B shows the convex curvilinear portion 516 compressed by a second force, which is greater than the first force, and which can result in a second displacement along curvilinear axis 524, which is greater than the first displacement. Rendition 516A shows the convex curvilinear portion 516 compressed by a third force, which is greater than the second force, and which can result in a third displacement along curvilinear axis 524, which is greater than the second displacement. The electrically conductive component 500 can tolerate a range of deflection while providing a gentle interface with a surface to which it mates.

Figure 6A:
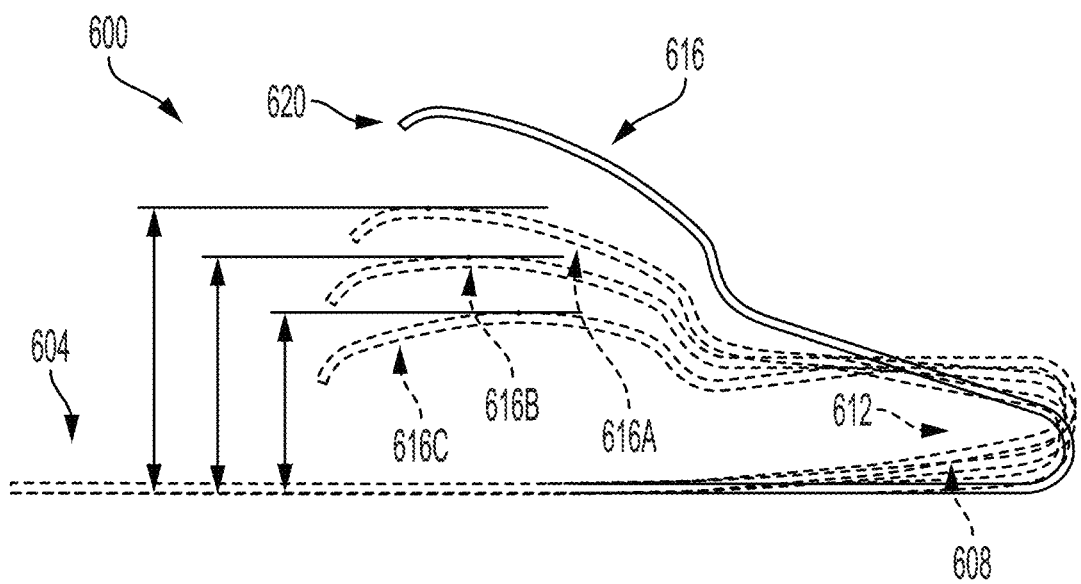
FIG. 6A illustrates an example cross-section of another electrically conductive component, according to an illustrative embodiment of the invention.

FIG. 6A illustrates an example cross-section of another electrically conductive component 600, according to an illustrative embodiment of the invention. The electrically conductive component 600 includes certain features that are similar to those shown in FIG. 5, such as a laterally offset portion 604, a convex curvilinear portion 616, and a distal end 620. In FIG. 6A, note that the region 616 is shown rendered with no compressive force, while the region 616A is shown rendered with a higher compressive force, the region 616B is shown rendered with an even higher compressive force, and the region 616C is rendered with an even higher compressive force. The electrically conductive component 600 also includes certain additional features. For example, the electrically conductive component 600 can include another convex curvilinear portion 608 (e.g., that comes into being while under compression, as shown in FIG. 6A) that gently recedes and/or slopes upward before encountering the bend region 612, such that a relatively smaller length of material is configured to lay flat against and/or contact the member to which it is ultimately affixed. In some embodiments, when the electrically conductive component 600 is compressed, the convex curvilinear portion 608 lifts slightly instead of bending down (which could increase the stiffness of the electrically conductive component 600). In some embodiments, the convex curvilinear portion 608 helps the electrically conductive component 600 handle a frictional shear load (which, if acting to the right, could cause the bend region 612 to dive downward). In this way, the convex curvilinear portion 608 can help maintain the contact force more consistent over a wider range of deflection.

Figure 6B:
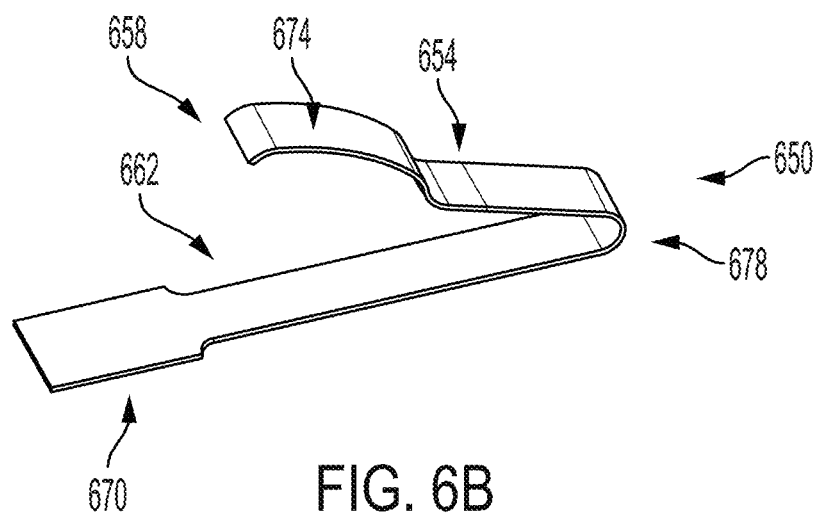
FIG. 6B illustrates an example top perspective view of another electrically conductive component, according to an illustrative embodiment of the invention.
Figure 6C:
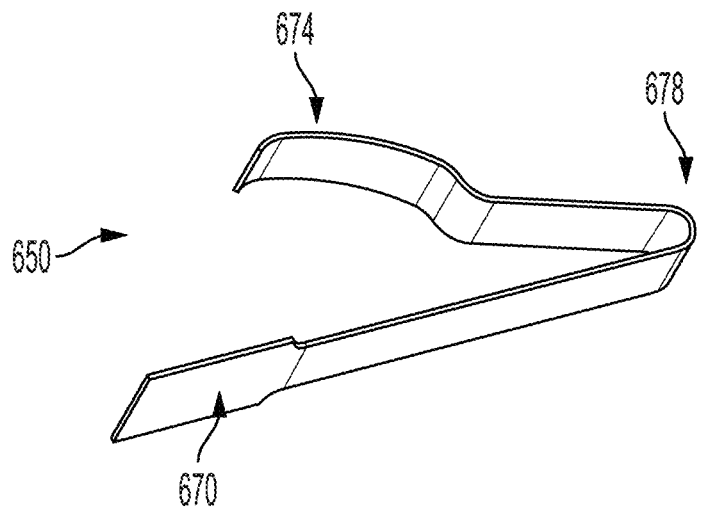
FIG. 6C illustrates an example bottom perspective of the electrically conductive component of FIG. 6B, according to an illustrative embodiment of the invention.

FIG. 6B illustrates an example top perspective view of another electrically conductive component 650, according to an illustrative embodiment of the invention, while FIG. 6C illustrates an example bottom perspective of the electrically conductive component 650, according to an illustrative embodiment of the invention. The electrically conductive component 650 can include similar features to the electrically conductive component 600 shown and described above in FIG. 6A. In FIG. 6B, a junction line 654 is shown in which the material on one side of the line 654 (e.g., the top portion 658 to the left of the line) has a first composition, while the material on the other side of the line (e.g., the portion 662 beginning on the top to the right of the line 654 and wrapping around the bend to the bottom portion) has a second composition. In some embodiments, the first composition is a palladium alloy. In some embodiments, the second composition is a copper alloy. In some embodiments, the junction line 654 is formed by a butt weld or another kind of junction known in the art.

The material choice for the electrically conductive components can also impact their performance over time, and a number of considerations may be relevant to that choice. First, it can be advantageous if material is able to endure a large sliding distance over the life of the contact (e.g., the circumference of the annular region times ten million cycles or more) without wearing rapidly (e.g., due to abrasive and/or adhesive wear). Second, it can be advantageous if the material has good electrical conductivity (e.g., at least 1 Megasiemen/meter). Third, it can be advantageous if the material does not corrode or oxidize (quickly or at all). Fourth, it can be advantageous if the material responds optimally to the applied force. In some embodiments, the optimum response is determined by balancing two opposing constraints: if the force is too light, the slip ring contact could bounce or have intermittent contact or excessive resistance; but if the force is too heavy, it could result in excessive friction or wear. In some embodiments, the force can be about 0.1N per electrically conductive component (e.g., an order of magnitude lower than some forces known in the art), or optionally about 0.07-0.25N, or optionally about 0.05-0.5N, or optionally about 0.02-0.40N. In some embodiments, the applied force is a nominal contact force (e.g., an intended contact force in the absence of tolerance stack-up error and/or any changes in force due to frictional shear). In some embodiments, this force range can allow an uncertainty of a number of millimeters (e.g., +0.3 mm) in PCB gap tolerance without varying substantially. In some embodiments, each component in the set of electrically conductive components exerts a contact force in a longitudinal direction of between 0.05-0.15N over a deformation range of 0.3 mm in the longitudinal direction (e.g., a direction perpendicular to a point of contact with a corresponding annular surface of the opposing member).

In some embodiments, including a larger number of lighter-force electrically conductive components can be advantageous to improving life and/or reducing friction (as contact resistance scales approximately inversely with the square root of contact force). In some embodiments, to extend their life, it can help for the electrically conductive components to maintain a force during operation within a narrow range while being tolerant of height variations in different components in the stack (e.g., the PCBs, contacts, solder layers, etc.). In some embodiments, the members including the slip rings and/or PCBs can have lower stiffness than existing contacts (e.g., so the initial deflection on assembly is greater than the expected deflection due to tolerances, flatness, etc.). In some embodiments (e.g., the embodiments shown in FIGS. 6A-6D), the bend region has a low profile "C-shape". This feature, on its own and/or combined with the laterally offset portion off to one side, can help maximize the length of the "beam" in bending, e.g., can be tuned so that the bend region (or "nose") lifts slightly off the PCB as the electrically conductive component deflects. In some embodiments, if the point of tangency were closer to the laterally offset portion, the bend region could lift too much and/or contact the corresponding PCB having electrically conductive annular surfaces. In some embodiments, if moved the other way, the bend region could become pinned to the contact PCB, increasing the stiffness.

Figure 6D:
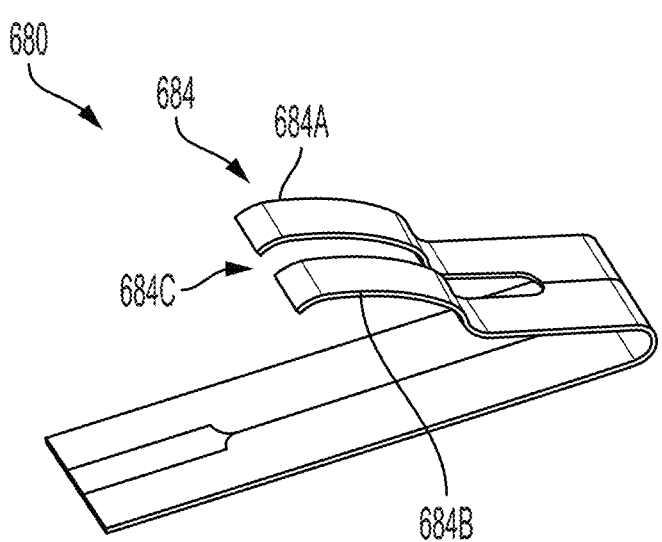
FIG. 6D illustrates an example top perspective view of another electrically conductive component having a bifurcated tip, according to an illustrative embodiment of the invention.

In some embodiments, the electrically conductive component 650 includes an affixing region 670 (e.g., on the underside of the laterally offset portion) that can be soldered or otherwise affixed to a member (e.g., a PCB) and a region of tangency 674 that can contact an opposing member (e.g., an annular surface on an opposing PCB). In some embodiments, the region of tangency 674 is located closer to the bend region 678 than the affixing region 670. Such a configuration can help reduce an amount by which the bend region 678 lifts upon compression (e.g., as described above in FIG. 6A). In some prior art configurations, the solder joint extends under the point of contact, which can shorten the active length of the beam and/or increase the stiffness of the beam. In contrast, having the region of tangency 674 cantilevered out from the affixing region 670 can reduce the lifting of the bend region 678. FIG. 6D illustrates an example top perspective view of another electrically conductive component 680 having a bifurcated contact region 684, according to an illustrative embodiment of the invention. The bifurcated contact region 684 has two tips 684A, 684B (e.g., two conductive contact portions of the region) separated by a gap 684C. In embodiments having such bifurcated tips, a total width of the contact could be larger while it takes up less space and/or uses less material. Additionally, use of a bifurcated tip may reduce the number of electrically conductive components required to meet a particular current requirement of the device.

Figure 7:
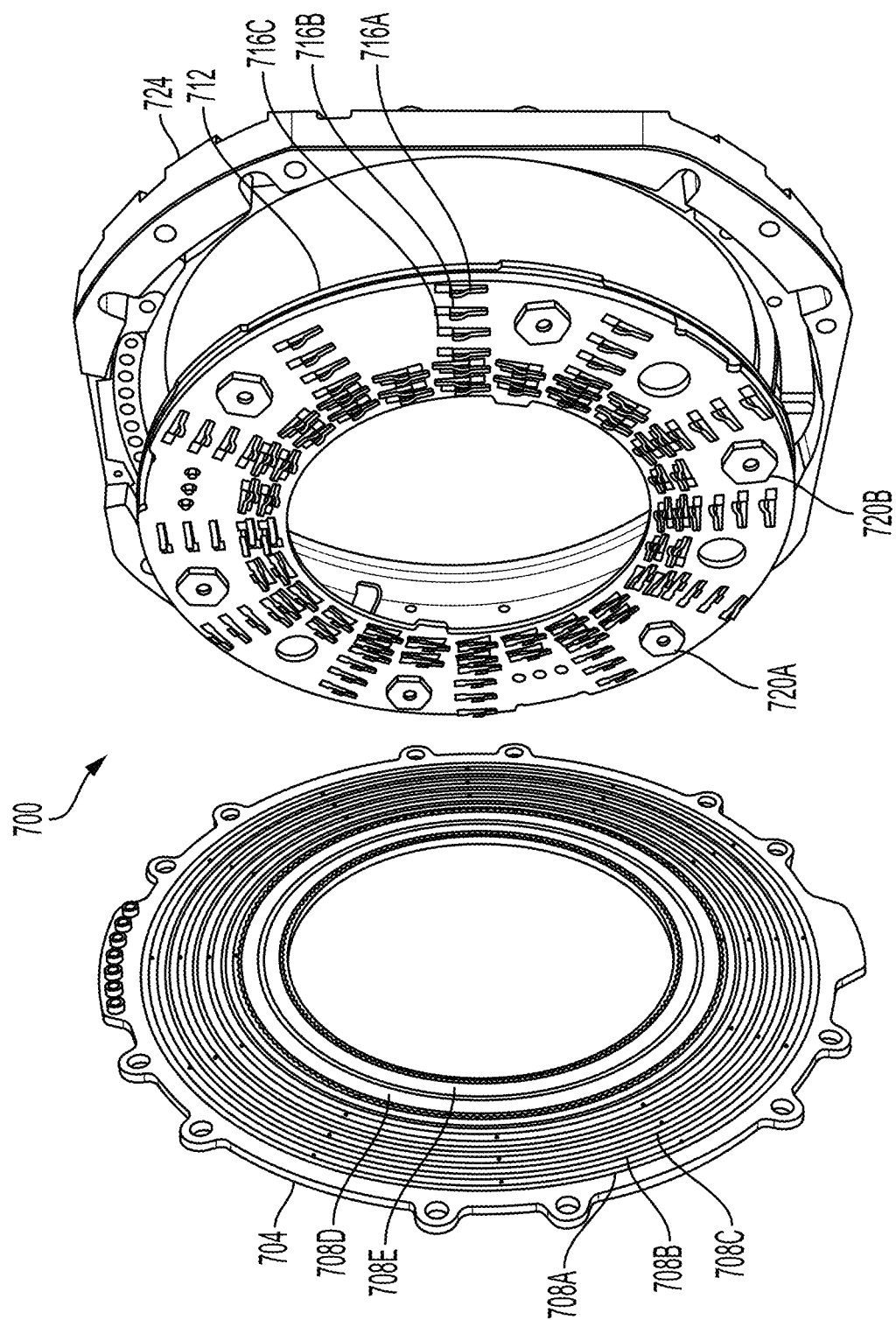
FIG. 7 illustrates an example exploded clam shell view of a first member including a set of electrically conductive annular surfaces and a second member including a set of electrically conductive components configured to contact the set of electrically conductive annular surfaces, according to an illustrative embodiment of the invention.

FIG. 7 illustrates an example exploded clam shell view 700 of a first member 704 (e.g., a slip ring and/or PCB) including a set of electrically conductive annular surfaces 708 (e.g., 708A, 708B and others as shown) and a second member 712 including a set of electrically conductive components 716 (e.g., 716A, 716B and others as shown) configured to contact the set of electrically conductive annular surfaces 708, according to an illustrative embodiment of the invention. Each electrically conductive annular surface in the set of electrically conductive annular surfaces 708 can be configured to contact one or more electrically conductive components 716. Each electrically conductive component in the set of electrically conductive components 716 can be a spring contact (such as the ones shown in FIG. 5 and/or FIGS. 6A-6D above), and many such electrically conductive components can be arranged around the second member 712 (e.g., as described above). In some embodiments, one or more electrically conductive annular surfaces 708 can be wider than certain others (e.g., 708D, 708E as shown). In some embodiments the wider electrically conductive annular surfaces 708D, 708E can carry power signals, while the narrower electrically conductive annular surfaces 708A-C can carry data signals. In some embodiments, the member 712 includes one or more bumpers 720 (e.g., 720A, 720B and others as shown). The bumpers 720 can protect the electrically conductive contacts 716 from being crushed inadvertently (e.g., in the event of a shock load). In some embodiments, the bumpers 720 are made of a low friction plastic (e.g., polyoxymethylene (POM) or Delrin®). Also shown in FIG. 7 is a housing 724 (e.g., comparable to the housing 404 shown and described above in FIG. 4A).

Together, a first member including a set of electrically conductive annular surfaces (e.g., the member 704) and a second member including a set of electrically conductive components configured to contact the set of electrically conductive annular surfaces (e.g., the member 712) can form a slip ring assembly. Each component in the set of electrically conductive components can include a first convex curvilinear portion configured to contact a corresponding annular surface in the set of electrically conductive annular surfaces. The first member and the second member can be included within a joint assembly of a robot (e.g., as shown in FIGS. 1-3 above), an actuator of a robot (e.g., as shown in FIGS. 4A-4B above), or other arrangements (e.g., a wheel drive mechanism of a robot). In some embodiments, the first member can be continuously rotatable about the second member. In some embodiments, when assembled as described, a fluorinated lubricant can be included between the first member and the second member, e.g., Nye lubricant Uniflor™ or another lubricant from the Teflon family. In some embodiments, hydrocarbon lubricants can be avoided, as they can react in the presence of electricity, break down with micro-arcing, and/or can be negatively affected by local hot spots.

Figure 8:
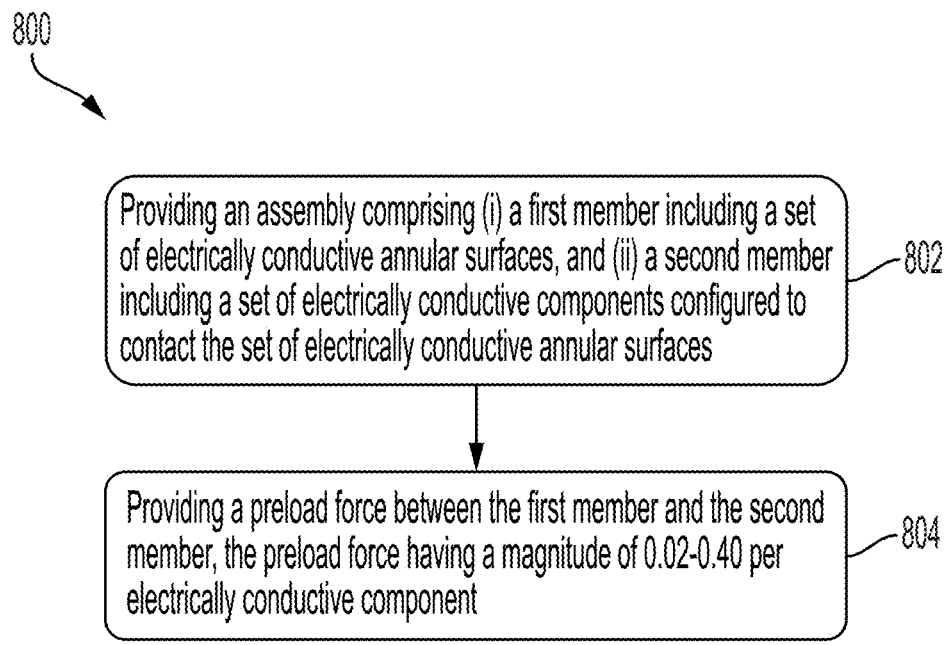
FIG. 8 is a flowchart of an exemplary computer-implemented method, according to an illustrative embodiment of the invention.

FIG. 8 is a flowchart of an exemplary computer-implemented method 1000, according to an illustrative embodiment of the invention. In act 802, an assembly is provided, the assembly comprising (i) a first member including a set of electrically conductive annular surfaces, and (ii) a second member including a set of electrically conductive components configured to contact the set of electrically conductive annular surfaces. In act 804, a preload force is provided between the first member and the second member, the preload force having a magnitude of 0.02-0.40N per electrically conductive component. In some embodiments, a thrust bearing system is used to press the first and second members together to a set distance, which can determine the force together with the set of electrically conductive components.

Figure 9:
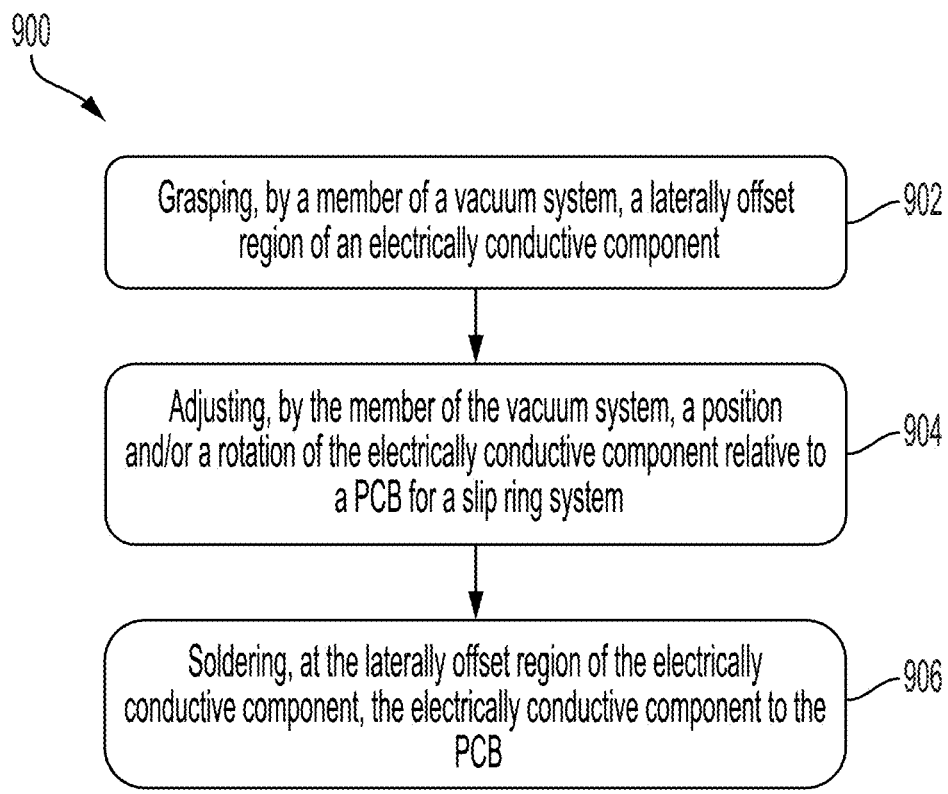
FIG. 9 is another flowchart of an exemplary computer-implemented method, according to an illustrative embodiment of the invention.

FIG. 9 is another flowchart of an exemplary computer-implemented method, according to an illustrative embodiment of the invention. In act 902, a member of a vacuum system grasps a laterally offset region of an electrically conductive component. In act 904, the member of the vacuum system adjusts a position and/or a rotation of the electrically conductive component relative to a PCB for a slip ring system. In act 906, the electrically conductive component is soldered to the PCB at the laterally offset region of the electrically conductive component. In some embodiments, during fabrication, each electrically conductive component in the set of electrically conductive components is configured to remain fixed relative to the PCB on which it is mounted while experiencing a lateral acceleration of up to a certain amount (e.g., 0.5 g) so that it stays stationary and does not fall over during pick and place and/or solder reflow operations.

A number of implementations have been described. Nevertheless, it will be understood that various modifications may be made without departing from the spirit and scope of the disclosure.

The invention claimed is:

1. An assembly comprising:
a first member including a set of electrically conductive annular surfaces; and
a second member including a set of electrically conductive components configured to contact the set of electrically conductive annular surfaces, wherein the first member and the second member are included within a component of a robot, and
wherein each component in the set of electrically conductive components includes a first convex curvilinear portion having a first end and a second end, wherein the first convex curvilinear portion is configured to contact a corresponding annular surface in the set of electrically conductive annular surfaces, and wherein a radius of curvature of the first convex curvilinear portion between the first end and the second end is greater than the radius of curvature of the first convex curvilinear portion at the first end and/or the second end.

2. The assembly of claim 1, wherein the first member and the second member are included within at least one of a joint assembly of the robot, an actuator of the robot, or a wheel drive mechanism of the robot.

3. The assembly of claim 1, wherein the first member is continuously rotatable about the second member.

4. The assembly of claim 1, wherein the assembly is configured to transfer electrical current of at least 1 amp between the first member and the second member.

5. The assembly of claim 1, wherein each component in the set of electrically conductive components is configured to transfer a current of at least 0.5 amps relative to a corresponding annular surface in the set of electrically conductive annular surfaces.

6. The assembly of claim 1, wherein the assembly is configured to transfer one or more data signals between the first member and the second member.

7. The assembly of claim 1, wherein the set of electrically conductive components includes one or more spring contacts.

8. The assembly of claim 1, wherein each component in the set of electrically conductive components includes a second convex curvilinear portion configured to recede from the second member.

9. The assembly of claim 1, wherein each component in the set of electrically conductive components includes a second convex curvilinear portion having a substantially semicircular shape.

10. The assembly of claim 1, wherein the radius of curvature of the first convex curvilinear portion of each component in the set of electrically conductive components is between 1 mm and 7 mm at a region of contact with the corresponding annular surface.

11. The assembly of claim 1, wherein
each electrically conductive component in the set of electrically conductive components includes a solder tab that has a linear width that is wider than a width of the first convex curvilinear portion, and
each solder tab extends laterally beyond a region of each first convex curvilinear portion.

12. The assembly of claim 1, wherein each electrically conductive component in the set of electrically conductive components includes two conductive contacts separated by a gap.

13. The assembly of claim 1, wherein each electrically conductive component in the set of electrically conductive components includes a contact zone formed of a bimetallic strip.

14. The assembly of claim 1, further comprising a fluorinated lubricant between the first member and the second member.

15. The assembly of claim 1, wherein the set of electrically conductive annular surfaces includes annular surfaces that are concentric.

16. The assembly of claim 1, wherein the first member and/or the second member comprises a printed circuit board.

17. A robot comprising:
a robot body,
a robot limb coupled to the robot body; and
an assembly coupled to the robot body and/or the robot limb, the assembly comprising:
a first member including a set of electrically conductive annular surfaces; and
a second member including a set of electrically conductive components configured to contact the set of electrically conductive annular surfaces,
wherein each component in the set of electrically conductive components includes a first convex curvilinear portion having a first end and a second end, wherein the first convex curvilinear portion is configured to contact a corresponding annular surface in the set of electrically conductive annular surfaces, and wherein a radius of curvature of the first convex curvilinear portion at a location between the first end and the second end is greater than the radius of curvature of the first convex curvilinear portion at the first end and/or the second end.

18. The robot of claim 17, wherein the first member is coupled to the robot body and the second member is coupled to the robot limb.

19. The robot of claim 17, wherein
the robot limb includes a first component coupled to a second component at a joint,
the first member is coupled to the first component, and
the second member is coupled to the second component.

20. The robot of claim 17, wherein the first member is continuously rotatable about the second member.

21. The assembly of claim 1, wherein a location of contact between the first convex curvilinear portion and a corresponding annular surface in the set of electrically conductive annular surfaces is determined based on an amount of compression of the first convex curvilinear portion.

* * * * *